United States Patent Office
3,164,539
Patented Jan. 5, 1965

3,164,539

PROCESS FOR PREPARING PHOTOPOLYMERIZABLE COMPOSITIONS

Charles Walter Smith, Little Silver, N.J., assignor to E. I. du Pont de Nemours and Company, Wilmington, Del., a corporation of Delaware No Drawing. Filed Mar. 29, 1961, Ser. No. 99,072
9 Claims. (Cl. 204—158)

This invention relates to a new process for preparing addition photopolymerizable compositions containing substantial amounts of cellulose esters.

In Plambeck U.S. Patent 2,760,863, Aug. 28, 1956, there are disclosed various processes for making photopolymerizable compositions and elements for the preparation of relief printing plates. These compositions may contain preformed polymeric materials which are compatible with the ethylenically unsaturated compound and addition polymerization initiator. Due to the variations in the polymeric material from batch to batch, the resulting photopolymerizable compositions and elements vary also. In an effort to overcome these variations, Munger U.S. Patent 2,923,673 discloses processes for making photopolymerizable compositions which are soluble in organic solvents or aqueous basic solutions by reacting in absence of any organic solvent a cellulose partial ester of a saturated aliphatic monocarboxylic acid, a dicarboxylic acid anhydride, an addition polymerizable ethylenically unsaturated compound, an esterification catalyst and an addition polymerization initiator activatable by actinic light. In the processes of the Munger patent, esterification is effected simultaneously with milling of the other ingredients to form a uniform mixture of photopolymerizable composition suitable for coating, casting or extruding into a layer.

An object of this invention is to provide a simple process for making photopolymerizable compositions of uniform properties which are soluble in organic solvents or aqueous basic solutions. Another object is to provide such a process which eliminates the separate preparation and isolation of the cellulose derivative. Yet another object is to provide such a process which results in a uniform composition which can be used readily to form photopolymerizable layers. Still further objects will be apparent from the following detailed description of the invention.

The process of this invention for making uniform photopolymerizable compositions in its broad aspect comprises admixing with (1) a cellulose ester of a saturated aliphatic monocarboxylic acid containing 2–4 carbon atoms, (2) a dicarboxylic acid anhydride, (3) a non-gaseous addition polymerizable ethylenically unsaturated compound containing at least one terminal ethylenic ($CH_2=C<$) group, having a boiling point above 100° C. at normal atmospheric pressure and being capable of forming a high polymer rapidly by free-radical photoinitiated, chain-propagated addition polymerization, and (4) an addition polymerization initiator activatable by actinic light within the range 120 to 700 millimicrons and having no significant thermal activity at the temperature utilized in the esterification and within the range 50° C. to 180° C. a compatible inert, liquid, organic solvent for said cellulose derivative, especially a solvent for a cellulose derivative readily miscible with water, and having a boiling point from about 55° C. to about 180° C. in an amount sufficient to form a mixture which can be stirred readily to form a uniform mixture, and heating the admixture to a temperature within the range 50° C. to 180° C. while stirring until the desired degree of esterification with the dicarboxylic acid anhydride is obtained and a uniform solution is formed. The solution can then be filtered, concentrated to remove part of the solvent and adjust the viscosity to the desired value, and used directly for coating or extruding. If desired, the solvent can be removed entirely and the photopolymerizable composition used in any desired manner.

In general the admixture with the solvent is heated at a reaction temperature from 50° C. to 180° C. while maintaining it under such a temperature for a period of about 10 minutes to about 24 hours. The preferred initiators are thermally inactive below 185° C. Other initiators, e.g., those that are thermally inactive up to a temperature of 50° C. can be used. The esterification temperature and all subsequent treatment temperatures must then be selected so that the temperature up to which the initiator is thermally inactive is never exceeded.

In general, the ethylenically unsaturated compound is present in an amount of 10% to 60% and the cellulose derivative reactant in an amount from 20% to 89% by weight, based on the final product.

In carrying out the invention, a quantity of a cellulose partial ester can be slurried in the organic solvent with the desired amount of the dicarboxylic acid anhydride, the addition polymerizable ethylenically unsaturated monomer, the esterification catalyst, the addition polymerization initiator and other desired adjuvants, e.g., addition polymerization inhibitor and other inert organic or inorganic filler material and the mixture is then heated in a suitable closed vessel equipped with a stirrer and a reflux condenser at a temperature from about 50° C. to 180° C., but not higher than the boiling point of the particular solvent used, for about 10 minutes to about 24 hours.

In a preferred manner of carrying out the invention a cellulose ester, e.g., cellulose acetate is used and is mixed in such a solvent, having a boiling point below about 80° C., preferably acetone, and admixed with a tertiary amine esterification catalyst and the other constituents described above and the mixture is then heated to the boiling point of the solvent and kept at this temperature under constant stirring until the desired degree of esterification and solution is achieved. The solution of photopolymerizable material is then filtered and cast onto a suitably prepared metal sheet support or other support so that, after evaporation of the solvent, a layer of solid, photopolymerizable material is obtained.

If desired, the filtered solution of photopolymerizable material is coated or extruded onto a temporary support, e.g., a glass plate or other smooth casting surface, and after evaporation of the solvent the sheet can be removed and charged into a rubber mill the rolls of which are heated to about 90° C. After a 2-minute milling cycle, the photopolymerizable mass can be formed into sheets and laminated to a permanent support as described in Munger U.S. Patent 2,923,673.

The dicarboxylic acid anhydride will usually be used in an amount sufficient in introduce at least 0.2 acid ester groups per glucose unit in the cellulose chain in order to impart a satisfactory degree of solubility to the basic washout solution.

A monocarboxylic acid anhydride can also be used at the same time to introduce monoester groups into the cellulose derivative reactant. They are usually added in an amount sufficient to introduce at least 0.05 ester groups per glucose unit. The use of one or more monocarboxylic acid anhydrides can result in mixed ester compositions which have improved physical properties, e.g., tensile properties and flexibility.

Anhydrides of the monocarboxylic acids which give a satisfactory product may range from 2 to 18 carbons in length, 2–4 carbons being preferred, e.g., propionic anhydride, butyric anhydride. The dicarboxylic acid anhydrides which may be used in accordance with the invention include succinic and gluataric anhydrides, i.e., those having 4 or 5 carbon atoms, succinic anhydride being the preferred compound. It is also possible to use anhydrides of aromatic dicarboxylic acids, e.g., phthalic anhydride.

In the preferred aspect of the invention, cellulose acetate having a degree of acetyl substitution of approximately 1.85, i.e., the number of acetyl groups per glucose unit in the cellulose chain, and succinic anhydride are used to form cellulose acetate succinate having the requisite degree of acid substitution.

Cellulose acetate with a degree of acetyl substitution of about 1.85 is one of the preferred reactants; the degree of acetyl substitution, however, may vary above or below that amount. In addition, other cellulose esters may be used, e.g., cellulose esters having free and esterifiable hydroxyl groups such as cellulose acetate propionate, cellulose acetate butyrate, cellulose propionate and cellulose butyrate.

The cellulose esters containing free acid groups made in photopolymerizable compositions in accordance with this invention should have an acid degree of substitution of from about 0.2 to 1.25, preferably in the range of 0.60 to 0.90, i.e., that many free carboxyl groups per glucose unit. Furthermore, the neutral degree of substitution should be in the range of from about 1.5 to 2.45, preferably about 1.85. By difference, therefore, the hydroxyl groups per glucose unit should lie between 0 and about 1.3, preferably 0.25 to 0.55.

Suitable ethylenically unsaturated compounds that can be used in accordance with the invention are the unsaturated esters of polyols, e.g., glycols of 2–12 carbon atoms and polyethylene and polypropylene glycols, particularly such esters of the alpha-methylene carboxylic acids, e.g., ethylene diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tetramethacrylate, 1,3-propanediol diacrylate, 1,5-pentanediol dimethacrylate, the bisacrylates and methacrylates of polyethylene glycols of molecular weight 200–500, unsaturated amides, particularly those of the alphamethylene carboxylic acids, and especially those of alpha, omega-diamines and oxygen-interrupted omega-diamines, such as methylene bis-acrylamide, methylene bis-methacrylamide, ethylene bis-methacrylamide, 1,6-hexamethylene bis-acrylamide, diethylene triamine tris-methacrylamide, bis(gamma-methacrylamidopropoxy)-ethane, beta-methacrylamidoethyl methacrylate, N-(beta-hydroxyethyl)-beta-(methacrylamido)ethyl acrylate and N,N-bis(beta-methacrylyloxyethyl)acrylamide; vinyl esters such as divinyl succinate, divinyl adipate, divinyl phthalate, divinyl terephthalate, divinyl benzene-1,3-dissulfonate, and divinyl butane-1,4-disulfonate; and unsaturated aldehydes, such as sorbaldehyde (hexadienal).

The esterification catalysts can be added in an amount ranging from 0 to 20% by weight based on the dry reactants. To improve the speed of the esterification reaction, however, it is desirable that a catalyst be used. Tertiary organic amines are especially useful and diethylcyclohexylamine is the preferred compound but triethylamine, tributylamine, triamylamine, tetramethyl guanidine, and amine salts, e.g., trimethylamine acetate and pyridine acetate are also useful. In addition, several inorganic esterification catalysts may be used. These include sodium carbonate, sodium phosphate, sodium borate, sodium acetate, calcium acetate, and magnesium acetate in addition to potassium acetate and potassium carbonate.

In the preferred photopolymerizable compositions, a thermal polymerization inhibitor, 0.001 to 2 percent, by weight, based on the weight of the ethylenically unsaturated compound, is also present. Useful inhibitors include preferably p-methoxyphenol, hydroquinone, p-toluquinone, alkyl- and aryl-substituted hydroquinones, tert-butyl catechol, pyrogallol, naphthylamines, beta-naphthol, p-benzoquinone, 2,6 - ditert-butyl-p-cresol, dicyclopentadienyliron, phenothiazine, pyridine, nitrobenzene, dinitrobenzene, chloranil, and thiazine dyes, e.g., thionine, thionine blue G, methylene blue B and toluidine blue O.

The esterification reaction, as well as any mixing and milling, casting, extruding, pressing, coating or laminating operations, should be carried out at temperatures and under conditions so that no significant thermal addition polymerization takes place. Also, these steps should be carried out in the absence of sufficient actinic radiation to effect addition polymerization.

The invention will be further illustrated by but is not intended to be limited to the following examples.

*Example I*

In a 3-necked flask equipped with a mechanical stirrer, a reflux condenser and a thermometer, the following ingredients were combined at room temperature:

| | | |
|---|---|---|
| Acetone | ml | 250 |
| Cellulose acetate (degree of acetyl substitution 1.85) | g | 50 |
| Triethylene glycol diacrylate | g | 35 |
| Succinic anhydride | g | 18 |
| Diethylcyclohexylamine | g | 12 |
| Anthraquinone | g | 0.035 |
| p-Methoxyphenol | g | 0.105 |

The resulting slurry was heated to 55° C. and kept at this temperature while stirring constantly. As the reaction progressed, essentially the entire contents of the flask became soluble and the original slurry became a solution. After two hours, the reaction mixture was cooled to room temperature. There was no evidence of polymerization of the triethylene glycol diacrylate.

The degree of succinyl substitution was determined by the method outlined in Example I of Munger U.S. Patent 2,923,673. It was found to be 0.591. The photopolymerizable composition could be used after the manner described in said patent to form photopolymerizable layers of uniform quality in photopolymerizable elements for making printing reliefs.

*Example II*

Example I was repeated, except that 100 g. of triethylene glycol diacrylate, 0.105 g. of anthraquinone and 0.315 g. of p-methoxyphenol were used in the reaction mixture before the start of the esterification reaction. After a reaction time of 1½ hours, the resulting solution was filtered, cast on a glass plate and the cast film was removed and milled for 2 minutes on a two-roll rubber mill at a roll temperature of 90° C. The polymer was then removed from the mill and granulated.

A photopolymerizable printing plate was prepared from the granules according to the method outline in Example I of Munger U.S. Patent 2,923,673. After exposure to ultraviolet radiation from a conventional ultraviolet lamp through a photographic negative and washing of the exposed layer with 0.04 N sodium hydroxide at room temperature, a printing plate was obtained that gave good impressions of excellent quality and showed a long press life when used for printing on a rotary press.

*Example III*

Example I was repeated, except that the esterification catalyst (diethylcyclohexylamine) was omitted. The esterification reaction progressed extremely slowly, so that after 4-hours reaction time only traces of succinyl substitution could be measured. However, no polymerization of the monomer occurred.

*Example IV*

Example I was repeated, except that the esterification catalyst (diethylcyclohexylamine) was omitted and the acetone replaced with pyridine. The reaction mixture was heated to 115° C. for 4 hours. The triethylene glycol diacrylate did not polymerize. An analysis showed that some succinyl substitution had taken place. However, the substitution was so low that the composition was not useful for preparing uniform photopolymerizable elements for making printing reliefs.

*Example V*

Example II was repeated, except that the acetone was replaced by the same amount of methyl ethyl ketone. The mixture was heated to the boiling point (about 80° C.) for one hour. The resulting solution was similar to that obtained in Example III. A photopolymerizable plate was prepared in like manner from which a high quality printing plate was obtained.

*Example VI*

A mixture of 1200 g. of cellulose acetate (degree of acetyl substitution 1.85), 428 g. of succinic anhydride, 20 g. of diethylcyclohexylamine, 900 g. of polyethylene glycol diacrylate obtained by esterification of polyethyleneglycol having an average molecular weight of 300, containing 0.9 g. of anthraquinone and 2.7 g. of p-methoxyphenol, and 3200 ml. of acetone were heated to the boiling point (about 56° C.) in a vessel equipped with stirrer, reflux condenser and thermometer. Periodically, a sample was taken and the degree of succinyl substitution determined:

| Reaction time, hrs.: | Succinyl, DS |
|---|---|
| ¼ | 0.44 |
| ½ | 0.46 |
| 1 | 0.46 |
| 2 | 0.48 |
| 3–4 | 0.53 |
| 4–5 | 0.58 |

After 5 hours, there was no indication of any polymerization of the monomer. The solution was cooled to room temperature and filtered through felt in a pressure filter. The liquid mixture was cast onto glass plates, and the acetone was allowed to evaporate. The resulting sheets were calendered to a uniform thickness of 0.040 inch and laminated onto a steel support coated with an adhesive layer of the type described in Burg U.S. patent application Ser. No. 750,868, filed July 25, 1958 (Patent No. 3,036,913, May 29, 1962) and corresponding to Belgian Patent No. 580,820. The laminate was cured in an oven at a temperature of 145° C. for 8 minutes. This plate was then exposed and treated as in Example II. The resulting printing plate was of excellent quality.

*Example VII*

The following ingredients were added to a 3-necked glass flask equipped with stirrer, reflux condenser and thermometer:

| | | |
|---|---|---|
| Cellulose acetate (degree of acetyl substition 1.85) | g. | 50 |
| Glycerol triacrylate | g. | 30 |
| Succinic anhydride | g. | 18 |
| Diethylcyclohexylamine | g. | 12 |
| Anthraquinone | g. | 0.035 |
| p-Methoxyphenol | g. | 0.105 |
| Cyclohexanone | ml. | 250 |

This mixture was held for 16 hours (overnight) at room temperature. After this time, the degree of succinyl substitution was 0.372. The flask was then heated to 55° C. and held at this temperature for 2 hours. The degree of succinyl substitution of the final product was 0.410 and the mixture was useful forming photopolymerizable layers of uniform quality for making printing reliefs.

Example VII shows that high reaction temperatures are not required for the esterification process to proceed. Obviously, the lower temperatures require a longer reaction time. The lower reaction temperatures are advantageous in the preparation of polymerizable compositions. Thus, polymerization initiators which would be thermally unstable at higher temperatures such as encountered in other processes can be used at lower temperatures, in accordance with this invention.

*Example VIII*

The following ingredients were added to a 3-necked reaction vessel or flask equipped with stirrer, reflux condenser and thermometer:

| | | |
|---|---|---|
| Acetone | ml. | 500 |
| Cellulose acetate (degree of acetyl substitution 1.85) | g. | 150 |
| Succinic anhydride | g. | 54 |
| Triethylene glycol diacrylate | g. | 105 |
| Triamylamine | g. | 12.4 |
| Anthraquinone | g. | 0.105 |
| p-Methoxyphenol | g. | 0.315 |

The resulting slurry was heated to the boiling point of the acetone (56° C.) and kept at this temperature for 4 hours while stirring constantly. The contents of the flask was then cooled to room temperature and filtered. The degree of succinyl substitution was determined as 0.58. The triethylene glycol diacrylate was not polymerized and the composition was useful for preparing uniform photopolymerizable elements for making printing reliefs.

*Example IX*

Example VIII was repeated, except that the triamylamine was replaced by the same amount (12.4 g.) of triethylamine. After a reaction time of 3 hours, an additional 12.4 g. of triethylamine was added to the flask and the reaction continued for 2 hours. The reaction mass was cooled to room temperature; the degree of succinyl substitution was 0.67. A photopolymerizable element prepared from this composition gave good quality printing reliefs.

Preferred addition polymerizable initiators activatable by actinic light and inactive thermally below 185° C. include each of the initiators of the anthraquinone type disclosed in Notley U.S. Patent No. 2,951,758, Sept. 6, 1960.

After prolonged storage, bloom (a white deposit) may appear on the unexposed element surface of photopolymerizable elements made from the photopolymerizable compositions prepared in accordance with this invention. The deposit may be wiped off before the element is exposed, however, without interference with the utility of the product. Certain salts can be added to the photopolymerizable compositions to reduce the tendency to bloom. These salts include, preferably, calcium acetate and, in addition, calcium chloride, calcium nitrate, magnesium oxide, magnesium methylate, etc. These salts may be present in amounts from 0.5 to 9.0 percent by weight based on the weight of the photopolymerizable composition and can be added at any stage of the process including that subsequent to esterification. The amount added should be kept as low as possible, e.g., 0.5 to 2 percent by weight, to prevent haze.

As will be apparent from the foregoing examples, the conditions of the process itself may vary. Depending on the solvent used, the reaction temperature can vary from about 50° C. to 150° C. and over. Thus, with a low boiling solvent, e.g., acetone (B.P. 56° C.) or methyl ethyl ketone (B.P. 80° C.) the reaction temperature is generally controlled by the boiling point of the solvent. Pressurized equipment can, however, be used so that reaction temperatures above the boiling point of the solvent are possible. With a high boiling solvent, e.g., pyridine (B.P. 115° C.) or cyclohexanone (B.P. 157° C.), the reaction temperature is generally kept below the boiling temperature of the solvent, i.e., at about 100° C. to 110° C. The higher the temperature used, the faster the reaction will be completed.

The procedural steps used in making the photopolymerizable compositions also may vary. For instance, one can mix at room temperature in any order or together a suitable solvent (e.g., acetone), the cellulose ester, the dicarboxylic anhydride, the esterification catalyst and the ethylenically unsaturated monomer, the initiator and the thermal inhibitor. The latter two can be added with said monomer.

The processes described above have the advantage that they give a solution of a photopolymerizable composition which can be used to prepare photopolymerizable articles, e.g., photopolymerizable elements for making printing plates without further purification except a simple filtration to eliminate insoluble impurities. In the preferred embodiment, the preparation of photopolymerizable sheets, the solution can be cast on suitably prepared supports, e.g., metal plates, including steel or aluminum plates as described in the patents identified above, and the solvent allowed to evaporate. A photopolymerizable plate suitable to prepare a printing plate is thus obtained.

Before casting the composition onto the base support, part of the solvent can be evaporated to adjust the viscosity of the casting solution to any desired value.

The photopolymerizable compositions of this invention are also suitable for other purposes than in the production of printing reliefs in which readily insolubilized, solid addition polymerizable compositions are useful, such as binders for television phosphors, to prepare screens or stencils for mytography, in producing ornamental effects in plastic articles of various types, and in processes disclosed in Belgian Patent No. 593,834.

This invention represents an economic advantage over prior art procedures of making photopolymerizable compositions. By this invention, a photopolymerizable composition containing a cellulose ester of a mono- and dicarboxylic acid can be prepared in a simple two-step operation compared to the numerous steps where the cellulose ester is made separately and then admixed with the ingredients of a photopolymerizable composition. This results in the saving of equipment, materials, and operating costs. The product is rapidly made and can be filtered through very fine media to eliminate impurities in some of the ingredients and result in a uniform composition. This filtration can be carried out immediately prior to the sheet-forming steps, thus avoiding contamination of the filtered solution in further treatment steps. The intimate mixture obtanied by dissolving all the ingredients in a common solvent improves the product homogeneity. Furthermore, the process being carried out under reflux conditions, volatilization losses are minimized, which, in turn, improves the bath-to-bath reproducibility. In addition, improved quality of the product is obtained due to the reduction in the number of operational steps.

I claim:

1. A process for making uniform photopolymerizable compositions which comprises (*a*) admixing the following constituents (1) a celluluose ester of a saturated aliphatic monocarboxylic acid containing 2-4 carbon atoms, (2) a dicarboxylic acid anhydride, (3) a non-gaseous addition polymerizable ethylenically unsaturated compound containing at least one terminal ethylenic ($CH_2=C<$) group, having a boiling point above 100° C. at normal atmospheric pressure and being capable of forming a high polymer rapidly by free-radical photoinitiated, chain-propagated addition polymerization, and (4) an addition polymerization initiator activatable by actinic light within the range 120 to 700 millimicrons and having no significant thermal activity at the temperature utilized in the esterification and within the range 50° C. to 180° C., with a compatible, inert, water-miscible liquid organic solvent for said cellulose derivative, said solvent having a boiling point from about 55° C. to about 180° C., in an amount sufficient to form a slurry which can be stirred readily to form a unifrom mixture, and (*b*) heating the admixture to a temperature within the range 50° C. to 180° C., while stirring the admixture, until the desired degree of esterification with the dicarboxylic anhydride is obtained and a uniform solution is formed.

2. A process according to claim 1 wherein said cellulose ester is cellulose acetate.

3. A process according to claim 1 wherein said ethylenically unsaturated compound is an acrylic acid ester of a saturated aliphatic polyhydric alcohol.

4. A process according to claim 1 wherein said ethylenically unsaturated compound is an acrylic acid ester of a polyethylene glycol.

5. A process according to claim 1 wherein the mixture is maintained at said temperature for a period within the range of about 10 minutes to about 12 hours until a uniform solution is obtained.

6. A process according to claim 1 wherein said solvent is acetone.

7. A process according to claim 1 wherein said solvent is pyridine.

8. A process according to claim 1 wherein said solvent is methyl ethyl ketone.

9. A process according to claim 1 wherein said solvent is cyclohexanone.

References Cited in the file of this patent

UNITED STATES PATENTS

| | | |
|---|---|---|
| 2,923,673 | Munger | Feb. 2, 1960 |
| 2,993,789 | Crawford | July 25, 1961 |